(12) United States Patent
Leitgeb et al.

(10) Patent No.: US 11,251,097 B2
(45) Date of Patent: Feb. 15, 2022

(54) METHOD AND DEVICE FOR MONITORING DICING TAPE TENSION

(71) Applicant: Infineon Technologies AG, Neubiberg (DE)

(72) Inventors: Walter Leitgeb, Wernberg (AT); Daniel Brunner, Villach (AT); Lukas Ferlan, Himmelberg (AT)

(73) Assignee: Infineon Technologies AG, Neubiberg (DE)

( * ) Notice: Subject to any disclaimer, the term of this patent is extended or adjusted under 35 U.S.C. 154(b) by 32 days.

(21) Appl. No.: 16/800,192

(22) Filed: Feb. 25, 2020

(65) Prior Publication Data

US 2020/0286795 A1 Sep. 10, 2020

(30) Foreign Application Priority Data

Mar. 5, 2019 (EP) .................................... 19160710

(51) Int. Cl.
*H01L 21/66* (2006.01)
*H01L 21/683* (2006.01)
*G01L 1/24* (2006.01)
*H01L 21/67* (2006.01)

(52) U.S. Cl.
CPC .............. *H01L 22/12* (2013.01); *G01L 1/241* (2013.01); *H01L 21/67132* (2013.01); *H01L 21/6836* (2013.01)

(58) Field of Classification Search
None
See application file for complete search history.

(56) References Cited

U.S. PATENT DOCUMENTS

| 2004/0041528 | A1* | 3/2004 | Eaton ..................... G11B 15/46 318/6 |
| 2007/0273865 | A1 | 11/2007 | Niitsu et al. |
| 2018/0215571 | A1 | 8/2018 | Inoue et al. |
| 2018/0356211 | A1* | 12/2018 | Otsuka ................. G01B 11/165 |
| 2020/0075387 | A1* | 3/2020 | Saito .......................... C09J 7/00 |

FOREIGN PATENT DOCUMENTS

WO 2015073873 A1 5/2015

* cited by examiner

*Primary Examiner* — Asok K Sarkar
(74) *Attorney, Agent, or Firm* — Murphy, Bilak & Homiller, PLLC

(57) ABSTRACT

A method of monitoring a dicing tape tension is described. The method includes acquiring tension data indicative of the dicing tape tension by automated optical inspection of a dicing tape.

20 Claims, 4 Drawing Sheets

METHOD AND DEVICE FOR MONITORING DICING TAPE TENSION

TECHNICAL FIELD

The disclosure relates to the field of wafer handling, and in particular to quality surveillance and production data documentation during wafer handling.

BACKGROUND

Many processes in wafer fabrication are automated to provide for a high degree of processing reliability and to maximize yields. Consequently, product and process control techniques are extensively used and quality problems or reductions in yield are traced back to specific product or processing conditions for improvement.

One specific process in wafer handling refers to the step of mounting a wafer on a dicing tape. Wafer mounting on a dicing tape is usually done by an automated wafer mounter, which adjusts the dicing tape and places the wafer on the adjusted dicing tape. Adjustment of the dicing tape relates, inter alia, to provide for a dicing tape tension which is suitable for subsequent wafer processing, such as dicing.

SUMMARY

According to a first aspect, a method of monitoring a dicing tape tension comprises acquiring tension data indicative of the dicing tape tension by automated optical inspection of each dicing tape.

According to a further aspect, a device for monitoring a dicing tape tension comprises means for acquiring tension data indicative of the dicing tape tension by automated optical inspection of each dicing tape.

According to another aspect, a computer program product comprises instructions to cause the device for monitoring a dicing tape tension to acquire tension data indicative of the dicing tape tension by automated optical inspection of each dicing tape and storing the tension data for a specific dicing tape in a database. The database is configured to link the tension data to a wafer identifier of the wafer which is diced on the specific dicing tape.

According to still another aspect, a computer program product comprises instructions to cause a data processing means for evaluating the tension data to derive a dicing tape tension quality measure per dicing tape and to update a parameter controlling the dicing tape tension of a dicing tape actually laminated on a frame based on the dicing tape tension quality measure of one or more preceding dicing tapes, and/or to stop a process of mounting wafers on dicing tapes based on the dicing tape tension quality measure of one or more preceding dicing tapes.

DETAILED DESCRIPTION

It is to be understood that the features of the various exemplary embodiments and examples described herein may be combined with each other, unless specifically noted otherwise.

Wafer dicing is a process used to singularize a semiconductor wafer into dies, also referred to as chips. To this end, the front-end processed wafer is placed on a dicing tape which serves as a mounting tool during the cutting process.

Figure 1:
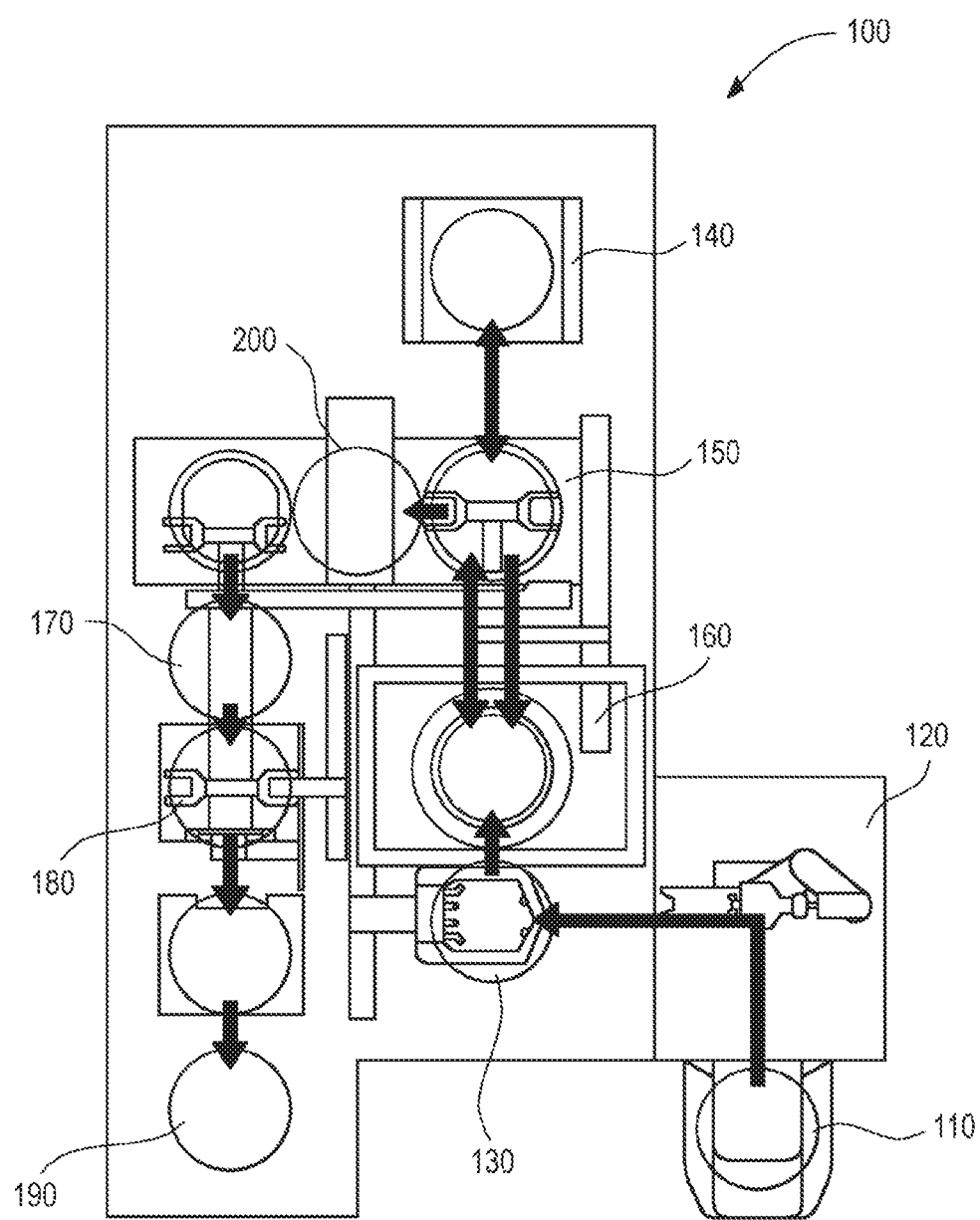
FIG. 1 is a schematic illustration of an exemplary wafer mounter.

In practice, placing the wafer on the respective dicing tape is a fully automated process carried out by a wafer handling equipment which is also referred to as a wafer mounter in the art. FIG. 1 schematically illustrates an example of a wafer mounter 100. Briefly, front-end pre-processed wafers are loaded at load station 110 to the wafer mounter 100. A robot arm 120 passes individual wafers to an alignment tool 130.

At the same time, a dicing tape is cut and laminated on a frame. Typically, the frame is an annular frame and cutting may be carried out by punching a dicing tape disc out of a continuous dicing tape rewound onto a roll. Dicing tape cutting and lamination may be performed at a dicing tape cutting and lamination station 140.

As will be explained in more detail further below, the dicing tape, when suspended on the frame, needs to have a specific tension. If the dicing tape tension is out of a specific range or tension window, several problems may occur during subsequent wafer handling. In particular, if the tape tension is too high, the distances between neighboring dies may be too small after wafer dicing (e.g. so-called die knocking may occur). Further, hairline cracks may be caused by inappropriate tape tension during subsequent processes, especially ringcut dicing or taiko ring removal processes.

The tape tension on the frame can be controlled during the process of bonding (e.g. laminating) the dicing tape on the frame. For example, a dicing tape disc is punched out of a continuous dicing tape and laminated on the frame in Y-direction. The tension in Y-direction can be controlled by the lamination process, e.g. by a stretching force applied to the dicing tape (disc) during lamination or by parameters of the lamination rollers. The tension in the X-direction (which is perpendicular to the Y-direction) may, e.g., be controlled by applying a pre-determined deformation to the annular frame during the lamination process. That is, the frame may be compressed by a specific distance in X-direction prior to the lamination of the dicing tape on the frame so as to exert a predetermined and reproducible expansion force on the dicing tape after lamination and frame release.

In practice, the dicing tape tension is a quantity which exhibits only slow variations during the automated dicing tape application process in the dicing tape cutting and lamination station 140. Conventionally, it is believed to be sufficient to check the tape tension on frame only one or a few times a week during the operation of the wafer mounter 100. Further, as the tape tension depends on the characteristics of the dicing tape (e.g. the manufacturer, the type of the dicing tape, physical properties of the dicing tape, etc.), it may be necessary to readjust the tape tension at times when dicing tape rolls are changed (e.g. when a roll of another manufacturer is used).

Still referring to FIG. 1, after attaching the dicing tape to the frame in the dicing tape cutting and lamination station 140, the dicing tape laminated on the frame may be transferred to a wafer mounting station 160. At the wafer mounting station 160, the wafer is placed on the pre-stretched dicing tape.

The frame-supported dicing tape carrying the wafer may be transferred back to a transfer arm 150 and moved to a device for monitoring the dicing tape tension 200.

The device for monitoring the dicing tape tension 200 includes means for acquiring tension data indicative of the dicing tape tension by automated optical inspection of each dicing tape. The device for monitoring the dicing tape tension 200 may be configured to acquire the tension data for each dicing tape, i.e. for each wafer processed by the wafer mounter 100. Exemplary features and techniques applied by the device for monitoring the dicing tape tension 200 will be explained in more detail further below.

Downstream the device for monitoring the dicing tape tension 200 the wafer may be transferred to a wafer labeling station 170 for attachment of a wafer ID (identifier) label on the wafer. By way of example, the wafer ID label may be a barcode label or any other identifier appropriate to individualize and track the wafer and/or the chips diced out of the wafer during subsequent processing (including, e.g., packaging, assembly and/or shipping to the customer).

Further stages of wafer handling in the wafer mounter 100 may relate to a delivery tool 180 configured to deliver the wafers mounted on the framed dicing tapes to a frame cassette and unloading of the frame cassette at output station 190.

Processes and stations of the wafer mounter 100 as described above are exemplary and could be replaced by other processes or stations or could be omitted (except the wafer mounting station 160) within the scope of this disclosure. In particular, the device for monitoring the dicing tape tension 200 could also be implemented as a station external of the wafer mounter 100, e.g. could be arranged downstream of the output station 190 of the wafer mounter 100.

Figure 2:
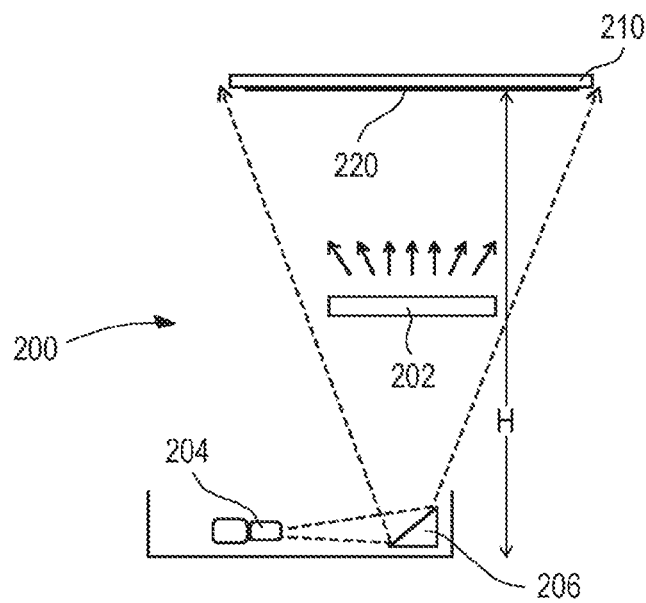
FIG. 2 is a schematic illustration of an exemplary device for monitoring a dicing tape tension.

FIG. 2 illustrates an exemplary device (or, more specifically, the hardware of such device) for monitoring a dicing tape tension 200. The device for monitoring a dicing tape tension 200 includes equipment for acquiring tension data indicative of the dicing tape tension by automated optical inspection of each dicing tape.

The device for monitoring a dicing tape tension 200 may include a light source 202 for illuminating a backside (bottom side) of a dicing tape 220 and/or a frame 210 on which the dicing tape 220 is mounted (e.g. laminated). More specifically, the frame 210 (e.g. an annular frame 210 of, e.g., 12 inches in diameter) is positioned at a defined location over the bottom of the device for monitoring a dicing tape tension 200. A wafer (not shown, e.g. as being hidden by the rim of the frame 210) may, e.g., be placed atop the dicing tape 220.

One option is that the light source 202 illuminates the full surface of the dicing tape 220 and/or the frame 210 to provide for reflected light from all areas within the outline of frame 210. Another possibility is to provide for an illumination only of specific areas or zones at the bottom side of the frame 210 and/or the dicing tape 220, e.g. at the rim of the frame 210 or at predetermined tape areas.

The light source 202 may emit RGB (red, green, blue) light for different dicing tapes 220. By way of example, the light source 202 may use RGB LEDs (light emitting diodes). The light source 202 may be designed as a ring light source (not shown) to allow reflected light from the full surface of the dicing tape 220 and/or frame 210 to pass through an opening of the ring light source 202. It is also possible to design the light source 202 to provide for a scanning illumination.

The device for monitoring a dicing tape tension 200 may further include a camera 204 for acquiring a full image or at least a partial image of the frame 210 and/or the dicing tape 220. A mirror 206 may be provided in the optical path between the frame 210 and/or the dicing tape 220 and the camera 204 to allow for a limited installation height H of (the hardware of) the device for monitoring a dicing tape tension 200 (e.g. the height H may be equal to or less than 390 mm to retrofit the device for monitoring a dicing tape tension 200 into a conventional wafer mounter 100).

Figure 3:
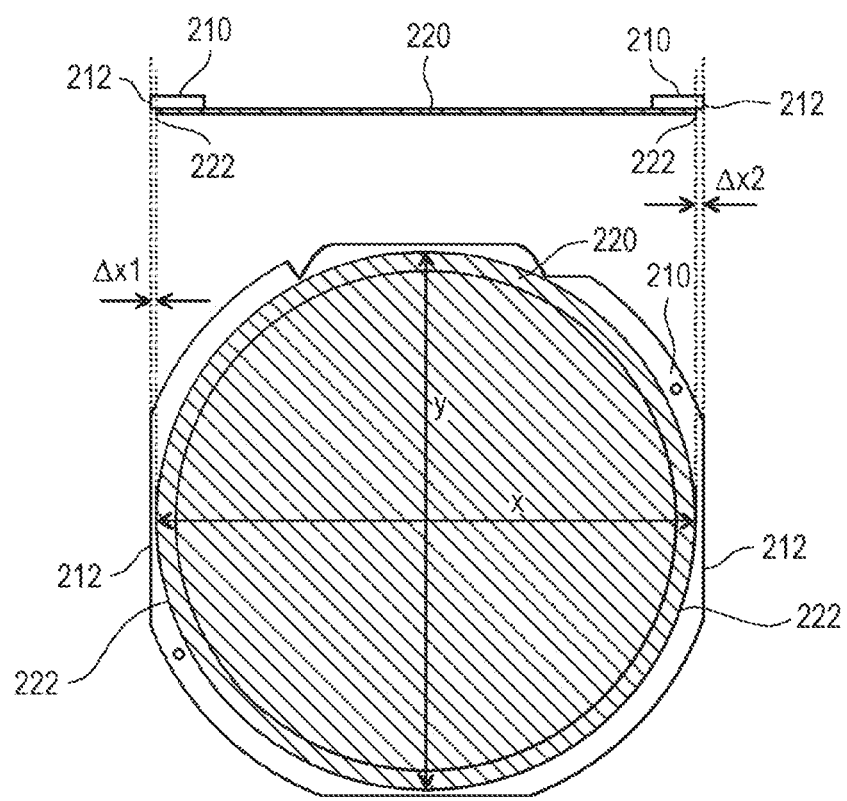
FIG. 3 illustrates a sectional view and a plan view of an example of a dicing tape laminated on a frame.

FIG. 3 illustrates a cross-sectional view (upper portion of FIG. 3) and a plan bottom view (lower portion of FIG. 3) of the frame 210 and the dicing tape 220 laminated thereon. FIG. 3 further illustrates a specific example of how to measure a tape expansion in X-direction and Y-direction, respectively. Tape expansion data in X-direction and Y-direction may then be translated in tape tension data by appropriate data processing means for computing the tape tension data.

Automated image analysis to measure a quantity indicative of a length dimension (e.g. in X- and/or in Y-direction) of the dicing tape 220 may include detecting a visual feature of the dicing tape 220. In FIG. 3 the visual feature of the dicing tape 220 in X-direction is, e.g., the edge 222 of the dicing tape 220, e.g. the right edge 222 of the dicing tape 220 and/or the left edge 222 of the dicing tape 220.

Further, automated image analysis may, e.g., include detecting a visual feature of the frame 210. In FIG. 3, for example, the visual feature of the frame 210 may be the frame edge 212, e.g. the frame edge 212 at the left side and the frame edge 212 at the right side of the frame 210.

Then, the distance $\Delta x1$ between the visual feature of the dicing tape 220 and the visual feature of the frame 210 at the left side of the frame 210 may be measured by automated image analysis and/or the distance $\Delta x2$ between the visual feature of the dicing tape 220 and the visual feature of the frame 210 at the right side of the frame 210 may be measured by automated image analysis.

As the dimension of the frame 210 in X-direction is precisely known, the measurement values $\Delta x1$ and/or $\Delta x2$ allow to precisely calculate the tape extension in X-direction. Further, since the tape extension in X-direction before lamination of the tape 220 on the frame 210 is precisely known (e.g. corresponds to the dimension of the punch which generates the dicing tape disc), the measurement values $\Delta x1$ and $\Delta x2$ are indicative of the tape expansion in X-direction.

Analogous measurements of $\Delta y1$ and $\Delta y2$ may be performed in Y-direction in order to compute the tape extension in Y-direction. From the tape extension in Y-direction, tape expansion and tape tension values in Y-direction may be derived as explained above with reference to the analysis of the $\Delta x1$, $\Delta x2$ measurement values.

It is not obligatory to use a visual feature of the frame 210 (here, e.g., the frame edge 212) as a reference line for measurement of the dicing tape 220 extension. Rather, it is also possible to only use a visual feature of the dicing tape 220 (e.g. opposing dicing tape edges 222) to measure the dicing tape 200 extension and to derive the dicing tape 200 expansion from the knowledge of the dicing tape 200 extension before lamination. However, a measurement based on a visual feature of the frame 210 as a reference provides, inter alia, the possibility to collect additional information, e.g. allows to track possible drifts of the position of the dicing tape 220 on the frame 210 over the time.

The exemplary measurements as outlined above (with or without referring to any reference at the frame 210) provides for global (i.e. non-local) mean tension data of the dicing tape 220 in X-direction and/or in Y-direction. Many variations are feasible to obtain such kind of data. For example, it is possible to use a line pattern or other marks in X-direction and/or in Y-direction on the dicing tape 220 as a visual feature rather than the edges 222 of the dicing tape 220. If one or more line patterns or marks are applied to the dicing tape 220, this may also allow to obtain local tension data, since non-uniformity of distances between lines of the patterns at different areas of the dicing tape 220 may be measured and evaluated. In other words, automated image analysis may be designed to measure any quantity indicative of a length dimension of the dicing tape 220 to derive non-local or local tape tension data in X- and/or Y-direction.

Further, a tension distribution of the dicing tape 220 can be measured by other means than a length measurement, e.g. by a photoelasticity measurement. As known in the art, photoelasticity describes changes in the optical properties of a material (here: the dicing tape 220) under mechanical deformation. Photoelasticity measurements may determine the tension distribution in the dicing tape 220, i.e. may provide for tension data which reflects the local tension distribution across the dicing tape 220.

It is to be noted that the acquisition of tension data via distance measurements and the acquisition of tension data via photoelasticity measurements may be combined. Such combination may provide for monitoring of the dicing tape 220 tension by collecting accurate mean tension data and tension distribution data in combination.

Figure 4:
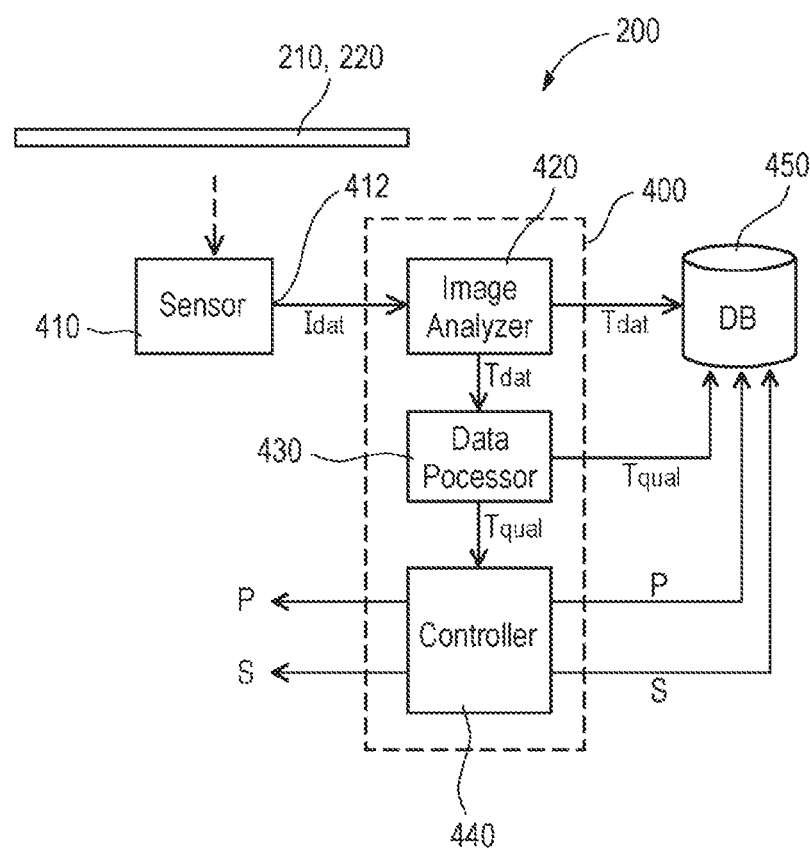
FIG. 4 is a block diagram schematically illustrating an exemplary device for monitoring a dicing tape tension and/or a computer program product adapted to execute instructions to operate the device and/or to be executed on the device.

FIG. 4 illustrates a block diagram of an exemplary device 200 for monitoring a dicing tape tension. The monitoring device 200 includes an optical sensor 410 for acquiring tension data indicative of the dicing tape tension by automated optical inspection of each dicing tape 220. The optical sensor 410 may be designed in accordance with features and processes described in conjunction with FIGS. 1-3. In particular, the optical sensor 410 may include the hardware of the device 200 as illustrated in FIG. 2, e.g. a light source 202 for illuminating the dicing tape 220 with light and a camera 204 for acquiring at least a partial image of the dicing tape 220.

The optical sensor 410 may output image data Idat at output 412. The image data Idat may be communicated to a computational environment 400 comprising an image analyzer 420, a (optional) data processor 430 and a (optional) controller 440.

The image analyzer 420 may be designed to analyze the image data Idat for detecting, e.g., visual features and/or photoelasticity characteristics, and may measure a quantity indicative of a length dimension of the dicing tape 220 and/or a tension distribution of the dicing tape 220 as, e.g., explained with reference to FIG. 3. The image analyzer 420 may be configured to derive tension data Tdat indicative of the dicing tape 220 tension from the measured quantity. The tension data Tdat may be local tension data or non-local, e.g. mean (averaged) tension data as described above.

The image data Idat can be analyzed using computer based or computer assisted image analyzing methods and tools, e.g. computer programs. Image analyzing methods may, e.g., comprise image segmentation and/or identification of visual features (such as frame or tape edges or line patterns). Image segmentation may comprise thresholding, i.e. generating a black and white image (or a grey scale value image) based on comparing the values of image voxels (e.g. brightness values) with a threshold (e.g. brightness threshold) or with multiple thresholds (e.g. multiple brightness thresholds). The segmented image may be analyzed for visual feature identification. Further, the image data (e.g. the segmented image) may be analyzed for identification of objects other than the visual features used for tension data generation, e.g. for the identification and (optionally) the classification of scratches, particles, etc. at the dicing tape 220 or at the bottom side of the wafer.

The tension data Tdat from the image analyzer 420 may be passed to a data processor 430. The data processor 430 may evaluate the tension data to derive a dicing tape tension quality measure per dicing tape. The dicing tape tension quality measure may be derived based on whether or not the tension data Tdat is within a specific range. More specifically, the data processor 430 may compare the tension data Tdat in X-direction with a specific tension data window (or range) for X-direction and may compare the tension data Tdat in Y-direction with a specific tension data window (or range) for Y-direction.

If both windows (ranges) are met, the data processor 430 may, e.g., output a tension quality measure Tqual indicating that the dicing tape tension is within the prescribed quality (e.g. "good quality"). If one or both of the tension data Tdat in X- and Y-direction are outside the boundaries of the respective windows (ranges), the data processor 430 may output that the dicing tape tension quality is low or insufficient (e.g. Tqual is "low quality" or "insufficient quality").

The dicing tape tension quality measure Tqual output by the data processor 430 may include a variety of information about the dicing tape tension of each dicing tape 220. For instance, the dicing tape tension quality measure Tqual may include a quality measure indicative of drifts (e.g. a continuous increase or a continuous decrease) of tension data Tdat over time or a quality measure indicative of any approach of the tension data Tdat to the boundaries of the tension data windows (ranges). Such or other quality measure Tqual may allow for an early recognition of unwanted or critical process developments during the operation of the wafer mounter 100.

Optionally, the dicing tape tension quality measure Tqual derived by the data processor 430 may be communicated to a controller 440. The controller 440 may be configured to update a parameter P controlling the dicing tape tension of a dicing tape actually laminated on a frame 210 based on the dicing tape tension quality measure Tqual of one or more preceding dicing tapes. By way of example, if the controller 440 is informed of a low dicing tape tension quality in the X-direction (based on the finding that the dicing tape tension in X-direction approaches the lower boundary of the dicing tape window), the controller 440 may output a parameter instructing a tool in the wafer mounter 100 to increase the pre-compression of the frame 210 in X-direction. Similarly, if a dicing tape tension in Y-direction is evaluated to approach the lower boundary of the dicing tape window for Y-direction, the tautness of the dicing tape during the lamination process may be increased.

As another example, the controller 440 may output a stop signal S. The stop signal S may stop the process of mounting wafers on dicing tapes, i.e. may stop operation of the wafer mounter 100. The issuance of the stop signal S may be based on the dicing tape tension quality measure Tqual of one or more preceding dicing tapes. As an example, if the dicing tape tension quality measure Tqual indicates that the actual dicing tape tension is out of range (i.e. beyond the boundaries of the dicing tape window), the stop signal S may be set to abort the manufacturing process in order to prevent that wafers are mounted on dicing tapes having a critical dicing tape tension.

In general, the (optional) controller 440 provides for a feedback functionality allowing to feed information derived from the evaluation of the measured dicing tape tension back to the manufacturing process. Based on this information, the manufacturing process may either be adjusted or stopped.

The device for monitoring the dicing tape tension 200 may further include or be coupled to a data storage means 450. The data storage means 450 may store the tension data Tdat (from image analyzer 420) for each dicing tape by using a database DB, wherein the database DB is configured to link the tension data Tdat to the wafer identifier (e.g. as applied in the wafer labelling station 170) of the specific wafer which is mounted on the specific dicing tape. That way, information about the individual dicing tape tension associated with each wafer may be available by accessing the database DB.

Further, as illustrated in FIG. 4, information output by the data processor 430 (i.e. the dicing tape tension quality measure Tqual) and/or process control information (process control parameter P and/or stop signal S) may optionally be stored in the data storage means 450.

The information stored in the data storage means 450 allows to precisely document and retrace the manufacturing process wafer-by-wafer. Database technology (including de-centralized blockchain database technology) may be used in this context. In particular, data storage and evaluation allows to better understand a relationship between dicing tape tension and production yield problems. Further, data storage in combination with database technology (including, e.g., blockchain database technology) allows to relate faulty products (e.g. chips, chip packages, assembled devices, etc.) reported or returned by the customer to the tension data Tdat and/or quality measure Tqual and/or process control information (e.g. P, S) of the specific dicing tape on which the corresponding wafer was mounted and diced during production.

Differently put, the methods and devices described herein allow for early manufacturing process intervention and process adjustment and/or for retroactive problem identification and retroactive improvement of the manufacturing process to prevent the identified problem in future.

Further, data stored in the data storage means 450 may be analyzed in terms of different dicing tape manufacturers, different dicing tape types, different dicing tape batches, different dicing tape physical characteristics such as tape viscosity and/or tape thickness, different dicing tape adhesives, etc. Based on such analysis, optimum settings of the parameters controlling the dicing tape tension during the lamination process can be derived. This may greatly facilitate the re-setting of these parameters when the dicing tape rolls are changed (e.g. if dicing tape rolls from another manufacturer or with other physical properties or with other adhesives etc. are used). As a result, the manufacturing process may be stabilized, the yield may be improved and the downtime of the wafer mounter 100 for maintenance and/or change of dicing tape rolls may be reduced.

Figure 5A:
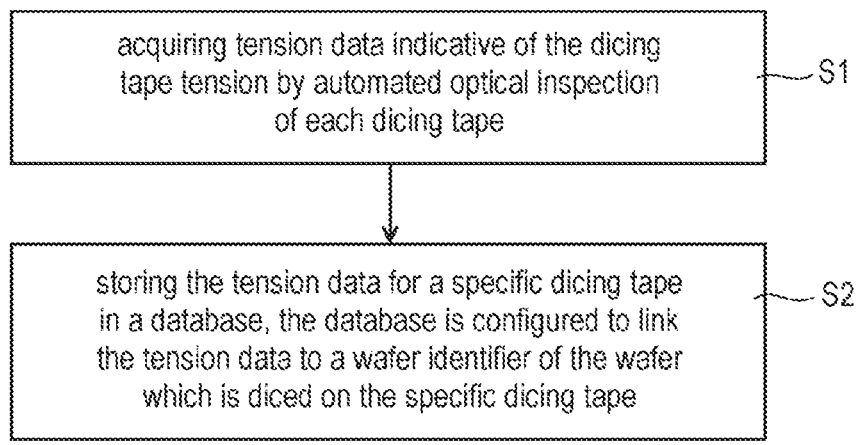
FIGS. 5A-5B are flowcharts schematically illustrating exemplary processes of a method of monitoring a dicing tape tension.

FIG. 5A illustrates an exemplary method of monitoring a dicing tape tension. At S1 tension data indicative of the dicing tape tension is acquired by automated optical inspection of each dicing tape. Many examples on how to acquire tension data are described above.

At S2 the tension data for a specific dicing tape is stored in a database, wherein the database is configured to link the tension data to a wafer identifier of the wafer which will be diced on the specific dicing tape. That way, wafer-individual tension data is made available.

Figure 5B:
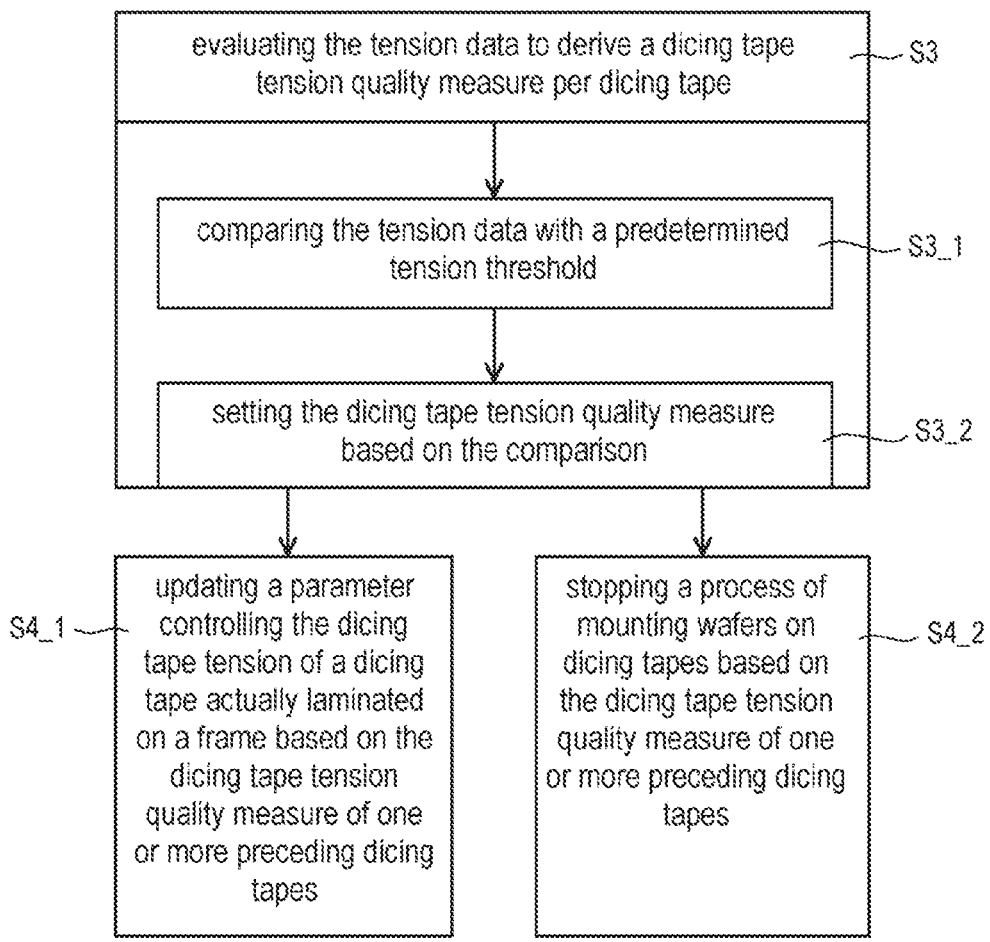

Referring to FIG. 5B, the method of FIG. 5A or a separate method (for processing already acquired tension data and which starts at S3) may comprise at S3 evaluating the tension data to derive a dicing tape tension quality measure per dicing tape. This may involve comparing the tension data with a predetermined tension threshold at S3_1, wherein the threshold may, e.g., be a boundary of a predetermined dicing tape tension window (or range), and setting the dicing tape quality measure Tqual based on the comparison at S3_2.

Still referring to FIG. 5B, a feedback functionality of the method may comprise updating a parameter controlling the dicing tape tension of the dicing tape actually laminated on a frame based on the dicing tape tension quality measure of one or more preceding dicing tapes at S4_1. Alternatively or in addition, at S4_2 a process of mounting wafers on dicing tapes based on the dicing tape tension quality measure of one or more preceding dicing tapes may be stopped.

The disclosure herein also supports a computer program product(s) including computer executable code or computer executable instructions that, when executed, causes at least one computer to execute one or more of the methods described herein, in particular the methods as described with respect to FIGS. 3, 4, 5A and 5B. Such computer program product(s) may include a readable storage medium storing program code thereon for use by a processor, the program code comprising instructions for performing any of the methods as described above.

More specifically, a first computer program product can include instructions to cause a device for monitoring a dicing tape tension to store the tension data at S2 in the data storage means 450. The first computer program product can further include instructions to derive the tension data. The tension data could be derived by automated image analysis to measure a quantity indicative of a length dimension of the dicing tape and/or a stress distribution of the dicing tape. The first computer program product may thus control operation of the data storage means (e.g. database) 450 and/or may control the operation of the image analyzer 420 which generates the tension data stored in the data storage means (e.g. database) 450.

Further, a second computer program product may include instructions to cause the data processor 430 to execute the processes S3, e.g. S3_1, e.g. S3_2 and/or the controller 440 to execute the processes S4_1 and/or S4_2. The second computer program product may thus operate the data processor 430 for computing dicing tape tension quality measures Tqual and/or the controller 440 to perform manufacturing process control tasks.

The second computer program product may also interface with the data storage means (e.g. database) 450 if the dicing tape tension quality measure Tqual and/or the parameter P and/or the stop signal S are to be stored in the data storage means 450.

That is, the computational environment 400 comprising the image analyzer 420 and, e.g., the data processor 430 and, e.g., the controller 440 may be implemented in software, in hardware or partly in software and partly in hardware. Further, the computational environment 400 (e.g. a computer running the computer program product(s)) may be interfaced to the sensor 410 via a LAN (Local Area Network) and/or may be interfaced to the data storage means (e.g. database) 450 by either a LAN or a global transport network such as, e.g., internet. The computational environment 400 may be part of a spatially distributed computational system or network with CPU cores (e.g. processors) deployed at different locations.

The following examples pertain to further aspects of the disclosure:

Example 1 is a method of monitoring a dicing tape tension, the method including acquiring tension data indicative of the dicing tape tension by automated optical inspection of each dicing tape.

In Example 2, the subject matter of Example 1 can optionally include storing the tension data for a specific dicing tape in a database, the database is configured to link the tension data to a wafer identifier of the wafer which is diced on the specific dicing tape.

In Example 3, the subject matter of Example 1 or 2 can optionally include wherein acquiring tension data comprises illuminating the dicing tape with light; acquiring at least a partial image of the dicing tape; and performing automated image analysis to measure a quantity indicative of a length dimension of the dicing tape and/or a tension distribution of the dicing tape.

In Example 4, the subject matter of Example 3 can optionally include wherein performing automated image analysis to measure a quantity indicative of a length dimension of the dicing tape comprises detecting a visual feature of the dicing tape; detecting a visual feature of a frame on which the dicing tape is laminated; and measuring a distance between the visual feature of the dicing tape and the visual feature of the frame.

In Example 5, the subject matter of Example 3 or 4 may optionally include wherein performing automated image analysis to measure a quantity indicative of a length dimension of the dicing tape comprises detecting a first visual feature of the dicing tape; detecting a second visual feature of the dicing tape; and measuring a distance between the first visual feature of the dicing tape and the second visual feature of the dicing tape.

In Example 6, the subject matter of any one of the preceding Examples may optionally include evaluating the tension data to derive a dicing tape tension quality measure per dicing tape.

In Example 7, the subject matter of Example 6 may optionally include wherein evaluating the tension data includes comparing the tension data with a predetermined tension threshold; and setting the dicing tape tension quality measure based on the comparison.

In Example 8, the subject matter of Example 6 or 7 may optionally include updating a parameter controlling the dicing tape tension of a dicing tape actually laminated on a frame based on the dicing tape tension quality measure of one or more preceding dicing tapes, and/or stopping a process of mounting wafers on dicing tapes based on the dicing tape tension quality measure of one or more preceding dicing tapes.

Example 9 is a device for monitoring a dicing tape tension, the device including means for acquiring tension data indicative of the dicing tape tension by automated optical inspection of each dicing tape.

In Example 10, the subject matter of Example 9 can optionally include wherein the means for acquiring tension data comprises a light source for illuminating the dicing tape with light; a camera for acquiring at least a partial image of the dicing tape; and an automated image analyzer to measure a quantity indicative of a length dimension of the dicing tape and/or a tension distribution of the dicing tape.

In Example 11, the subject matter of Example 9 or 10 can optionally include a data storage means for storing the tension data for a specific dicing tape in a database, the database is configured to link the tension data to a wafer identifier of the wafer which is diced on the specific dicing tape.

In Example 12, the subject matter of any one of Examples 9 to 11 can optionally include a data processing means for evaluating the tension data to derive a dicing tape tension quality measure per dicing tape.

In Example 13, the subject matter of Example 11 or 12 can optionally include wherein the data processing means is further configured to update a parameter controlling the dicing tape tension of a dicing tape actually laminated on a frame based on the dicing tape tension quality measure of one or more preceding dicing tapes, and/or to stop a process of mounting wafers on dicing tapes based on the dicing tape tension quality measure of one or more preceding dicing tapes.

Example 14 is a computer program product comprising instructions to cause the device of Example 11 to execute the steps of the method of Example 2.

Example 15 is a computer program product comprising instructions to cause the device of Example 12 to execute the steps of the method of Example 8.

In Example 16, the subject matter of Example 8 can optionally include wherein the parameter is a bias deflection of a frame on which the dicing tape is laminated and/or a lamination parameter controlling the tension of the dicing tape upon lamination on the frame.

In Example 17, the subject matter of Example 7 can optionally include wherein the predetermined tension threshold is dependent on one or more of a viscosity, type, manufacturer, thickness, and adhesive material of the dicing tape.

Example 18 is a wafer mounter including a device for monitoring a dicing tape tension according to any one of Examples 9 to 13.

In Example 19, the subject matter of Example 9 can optionally include means for illuminating the dicing tape with light; and means for acquiring at least a partial image of the dicing tape.

In Example 20, the subject matter of Example 9 can optionally include means for performing automated image analysis to measure a quantity indicative of a length dimension of the dicing tape and/or a tension distribution of the dicing tape.

In Example 21, the subject matter of Example 20 can optionally include that the means for performing automated image analysis to measure a quantity indicative of a length dimension of the dicing tape comprises means for detecting a visual feature of the dicing tape; means for detecting a visual feature of a frame on which the dicing tape is laminated; and means for measuring a distance between the visual feature of the dicing tape and the visual feature of the frame.

In Example 22, the subject matter of Example 20 or 21 can optionally include that the means for performing automated image analysis to measure a quantity indicative of a length dimension of the dicing tape comprises means for detecting a first visual feature of the dicing tape; means for detecting a second visual feature of the dicing tape; and means for measuring a distance between the first visual feature of the dicing tape and the second visual feature of the dicing tape.

In Example 23, the subject matter of any one of the Examples 9 and 20 to 22 may optionally include means for evaluating the tension data to derive a dicing tape tension quality measure per dicing tape.

In Example 24, the subject matter of Example 23 may optionally include that the means for evaluating the tension data comprises means for comparing the tension data with a predetermined tension threshold; and means for setting the dicing tape tension quality measure based on the comparison.

In Example 25, the subject matter of Example 23 or 24 may optionally include means for updating a parameter controlling the dicing tape tension of a dicing tape actually laminated on a frame based on the dicing tape tension quality measure of one or more preceding dicing tapes, and/or means for stopping a process of mounting wafers on dicing tapes based on the dicing tape tension quality measure of one or more preceding dicing tapes.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of monitoring a dicing tape tension, the method comprising:
    acquiring tension data indicative of the dicing tape tension by automated optical inspection of a dicing tape.
2. The method of claim 1, further comprising:
    storing the tension data for the dicing tape in a database, the database being configured to link the tension data to a wafer identifier of the wafer which is diced on the dicing tape.
3. The method of claim 1, wherein acquiring the tension data comprises:
    illuminating the dicing tape with light;
    acquiring at least a partial image of the dicing tape; and
    performing automated image analysis to measure a quantity indicative of a length dimension of the dicing tape and/or a tension distribution of the dicing tape.
4. The method of claim 3, wherein performing automated image analysis to measure the quantity indicative of the length dimension of the dicing tape comprises:
    detecting a visual feature of the dicing tape;
    detecting a visual feature of a frame on which the dicing tape is laminated; and
    measuring a distance between the visual feature of the dicing tape and the visual feature of the frame.
5. The method of claim 3, wherein performing automated image analysis to measure the quantity indicative of the length dimension of the dicing tape comprises:
    detecting a first visual feature of the dicing tape;
    detecting a second visual feature of the dicing tape; and
    measuring a distance between the first visual feature of the dicing tape and the second visual feature of the dicing tape.
6. The method of claim 1, further comprising:
    evaluating the tension data to derive a dicing tape tension quality measure for the dicing tape.
7. The method of claim 6, wherein evaluating the tension data comprises:
    comparing the tension data with a predetermined tension threshold; and
    setting the dicing tape tension quality measure based on the comparison.
8. The method of claim 6, further comprising:
    updating a parameter controlling the dicing tape tension of a dicing tape actually laminated on a frame based on the dicing tape tension quality measure of one or more preceding dicing tapes.
9. The method of claim 6, further comprising:
    stopping a process of mounting wafers on dicing tapes based on the dicing tape tension quality measure of one or more preceding dicing tapes.
10. A device for monitoring a dicing tape tension, the device comprising:
    an optical sensor configured to acquire tension data indicative of the dicing tape tension by automated optical inspection of a dicing tape.
11. The device of claim 10, wherein the optical sensor comprises:
    a light source for illuminating the dicing tape with light; and
    a camera for acquiring at least a partial image of the dicing tape.
12. The device of claim 10, further comprising:
    an automated image analyzer configured to measure a quantity indicative of a length dimension of the dicing tape and/or a tension distribution of the dicing tape.
13. The device of claim 10, further comprising:
    data storage configured to store the tension data for the dicing tape in a database, the database being configured to link the tension data to a wafer identifier of the wafer which is diced on the dicing tape.
14. The device of claim 10, further comprising:
    a data processor configured to evaluate the tension data to derive a dicing tape tension quality measure for the dicing tape.
15. The device of claim 14, wherein the data processor is further configured to update a parameter controlling the dicing tape tension of a dicing tape actually laminated on a frame based on the dicing tape tension quality measure of one or more preceding dicing tapes.
16. The device of claim 14, wherein the data processor is further configured to stop a process of mounting wafers on dicing tapes based on the dicing tape tension quality measure of one or more preceding dicing tapes.
17. A computer program product comprising a non-transitory computer readable medium storing a computer program operable to monitor a dicing tape tension, the computer program comprising:
    program instructions to acquire tension data indicative of the dicing tape tension by automated optical inspection of a dicing tape.
18. The computer program product of claim 17, further comprising:
    program instructions to store the tension data for the dicing tape in a database, the database being configured to link the tension data to a wafer identifier of the wafer which is diced on the dicing tape.
19. The computer program product of claim 17, further comprising:
    program instructions to update a parameter controlling the dicing tape tension of a dicing tape actually laminated on a frame based on the dicing tape tension quality measure of one or more preceding dicing tapes.
20. The computer program product of claim 17, further comprising:
    program instructions to stop a process of mounting wafers on dicing tapes based on the dicing tape tension quality measure of one or more preceding dicing tapes.

* * * * *